(12) United States Patent
Kunihiro

(10) Patent No.: US 11,875,866 B2
(45) Date of Patent: *Jan. 16, 2024

(54) MEMORY PROGRAMMING METHODS AND MEMORY SYSTEMS

(71) Applicant: Micron Technology, Inc., Boise, ID (US)

(72) Inventor: Takafumi Kunihiro, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/581,067

(22) Filed: Sep. 24, 2019

(65) Prior Publication Data

US 2020/0020409 A1 Jan. 16, 2020

Related U.S. Application Data

(63) Continuation of application No. 15/631,162, filed on Jun. 23, 2017, now Pat. No. 10,438,675, which is a
(Continued)

(51) Int. Cl.
*G11C 7/00* (2006.01)
*G11C 17/18* (2006.01)
(Continued)

(52) U.S. Cl.
CPC .............. *G11C 17/18* (2013.01); *G11C 7/00* (2013.01); *G11C 11/005* (2013.01);
(Continued)

(58) Field of Classification Search
CPC ......... G11C 16/10; G11C 16/24; G11C 16/26; G11C 17/00; G11C 8/12
See application file for complete search history.

(56) References Cited

U.S. PATENT DOCUMENTS 5,761,115 A 6/1998 Kozicki et al.
5,999,447 A 12/1999 Naura et al.
(Continued)

FOREIGN PATENT DOCUMENTS

EP 1727151 11/2006

OTHER PUBLICATIONS

"A Brief History and Explanation of Otp Memory", available online at http://www.articlesnatch.com/Article/A-Brief-History-And-Explanation-Of-Otp-Memory/909407, 2005, 2 pages.
(Continued)

*Primary Examiner* — Mohammed A Bashar
(74) *Attorney, Agent, or Firm* — Wells St. John P.S.

(57) ABSTRACT

Memory programming methods and memory systems are described. One example memory programming method includes programming a plurality of main cells of a main memory and erasing a plurality of second main cells of the main memory. The memory programming method further includes first re-writing one-time programmed data within a plurality of first one-time programmed cells of a one-time programmed memory during the programming and second re-writing one-time programmed data within a plurality of second one-time programmed cells of a one-time programmed memory during the erasing. Additional method and apparatus are described.

26 Claims, 4 Drawing Sheets

Related U.S. Application Data continuation of application No. 14/853,557, filed on Sep. 14, 2015, now Pat. No. 9,691,441, which is a continuation of application No. 13/546,919, filed on Jul. 11, 2012, now Pat. No. 9,135,978.

(51) Int. Cl.
| | | |
|---|---|---|
| *G11C 11/00* | (2006.01) | |
| *G11C 13/00* | (2006.01) | |
| *G11C 16/34* | (2006.01) | |
| *G11C 11/406* | (2006.01) | |
| *G11C 17/16* | (2006.01) | |

(52) U.S. Cl.
CPC ........ *G11C 11/406* (2013.01); *G11C 13/0033* (2013.01); *G11C 16/3431* (2013.01); *G11C 17/16* (2013.01)

(56) References Cited

U.S. PATENT DOCUMENTS

| | | | |
|---|---|---|---|
| 6,044,012 | A | 3/2000 | Rao et al. |
| 6,366,495 | B2 | 4/2002 | Miwa et al. |
| 6,728,137 | B1 | 4/2004 | Lin |
| 6,985,378 | B2 | 1/2006 | Kozicki |
| 7,218,547 | B2 | 5/2007 | Kurth et al. |
| 7,337,282 | B2 | 2/2008 | Happ et al. |
| 7,508,693 | B2 | 3/2009 | Chen |
| 7,675,766 | B2 | 3/2010 | Kozicki |
| 7,855,147 | B1 | 12/2010 | Dulkin et al. |
| 7,929,349 | B2 | 4/2011 | Seol et al. |
| 8,003,971 | B2 | 8/2011 | Happ et al. |
| 8,032,727 | B2 | 10/2011 | Brownhill et al. |
| 8,059,479 | B2 | 11/2011 | Kurjanowicz |
| 8,122,307 | B1 | 2/2012 | Lindhorst et al. |
| 8,279,657 | B2 | 10/2012 | Takagi et al. |
| 8,331,128 | B1 | 12/2012 | Derhacobian et al. |
| 8,547,736 | B2 | 10/2013 | Rao et al. |
| 8,675,396 | B1 * | 3/2014 | Derhacobian ........ G11C 29/816 365/148 |
| 8,804,399 | B2 | 8/2014 | Sills et al. |
| 8,804,401 | B2 | 8/2014 | Sugimae |
| 8,913,449 | B2 | 12/2014 | Chung |
| 8,957,399 | B2 | 2/2015 | Wei |
| 9,053,789 | B1 | 6/2015 | Ertosun |
| 9,117,522 | B2 | 8/2015 | Matsunami |
| 9,135,978 | B2 | 9/2015 | Kunihiro |
| 9,165,648 | B1 | 10/2015 | Jameson, III |
| 9,293,196 | B2 | 3/2016 | Otsuka et al. |
| 9,691,441 | B2 | 6/2017 | Kunihiro |
| 9,911,489 | B2 | 3/2018 | Otsuka et al. |
| 10,395,731 | B2 | 8/2019 | Otsuka et al. |
| 10,438,675 | B2 | 10/2019 | Kunihiro |
| 10,783,961 | B2 | 9/2020 | Otsuka et al. |
| 2006/0055065 | A1 | 3/2006 | Liu et al. |
| 2006/0163734 | A1 | 7/2006 | Thei et al. |
| 2006/0265548 | A1 | 11/2006 | Symanczyk et al. |
| 2007/0101115 | A1 | 5/2007 | Murakami |
| 2007/0157000 | A1 | 7/2007 | Qawami et al. |
| 2007/0274120 | A1 | 11/2007 | Pinnow et al. |
| 2008/0253167 | A1 | 10/2008 | Symanczyk |
| 2008/0273370 | A1 | 11/2008 | Keller et al. |
| 2008/0310211 | A1 | 12/2008 | Toda et al. |
| 2008/0320208 | A1 | 12/2008 | Nagashima et al. |
| 2009/0157953 | A1 | 6/2009 | Matsubara et al. |
| 2010/0123542 | A1 | 5/2010 | Vaithyanathan et al. |
| 2010/0319971 | A1 | 12/2010 | Lin |
| 2011/0066787 | A1 | 3/2011 | Markey et al. |
| 2011/0222330 | A1 | 9/2011 | Lee et al. |
| 2012/0044746 | A1 * | 2/2012 | Chung ............... G11C 13/0028 365/148 |
| 2012/0047322 | A1 | 2/2012 | Chung |
| 2012/0095966 | A1 * | 4/2012 | Yogev ................. G06F 12/0238 707/648 |
| 2012/0320657 | A1 * | 12/2012 | Chung ............... G11C 13/0023 365/96 |
| 2013/0021835 | A1 | 1/2013 | Hwang |
| 2013/0182487 | A1 | 7/2013 | Les et al. |
| 2013/0188414 | A1 | 7/2013 | Kawal |
| 2014/0016393 | A1 | 1/2014 | Kunihiro |
| 2014/0131653 | A1 | 5/2014 | Lee |
| 2014/0268992 | A1 | 9/2014 | Otsuka et al. |
| 2016/0005442 | A1 | 1/2016 | Kunihiro |
| 2016/0203861 | A1 | 7/2016 | Otsuka et al. |
| 2017/0294235 | A1 | 10/2017 | Kunihiro |
| 2018/0144792 | A1 | 5/2018 | Otsuka et al. |
| 2019/0311767 | A1 | 10/2019 | Otsuka et al. |

OTHER PUBLICATIONS

Aratani et al., "A Novel Resistance Memory with High Scalability and Nanosecond Switching", IEEE International Electronic Devices Meeting Technical Digest, 2007, United States, pp. 783-786.

Ertosun, U.S. Appl. No. 61/636,800, filed Apr. 23, 2012, titled "Programmed/Triggered Cell Annihilation For Resistive Switching Memory Devices", 11 pages.

Gilbert et al., "An Embeddable Multilevel-Cell Solid Electrolyte Memory Array", IEEE Journal of Solid-State Circuits vol. 42, No. 6, Jun. 2007, United States, pp. 1383-1391.

Otsuka et al., U.S. Appl. No. 16/437,997, filed Jun. 11, 2019, titled "Memory Cells, Memory Systems, and Memory Programming Methods", 35 pages.

Peng et al., "Resistive Switching of Au/SnO/Au Resistive Memory: An in situ Obervation of Conductive Bridge Formation", Nanoscale Research Letters vol. 7, 2012, United States, 6 pages.

Tan et al., "Overview of Wafer-Level 3D ICs", Process Technology, Springer, 2008, United States, 11 pages.

Wong, "Time Dependent Dielectric Breakdown in Copper Low-k Interconnects: Mechanisms and Reliability Models", Materials vol. 5, 2012, Switzerland, pp. 1602-1625.

\* cited by examiner

MEMORY PROGRAMMING METHODS AND MEMORY SYSTEMS

RELATED PATENT DATA

This application is a continuation of and claims priority to U.S. patent application Ser. No. 15/631,162, filed Jun. 23, 2017, which is a continuation of and claims priority to U.S. patent application Ser. No. 14/853,557, filed Sep. 14, 2015, now U.S. Pat. No. 9,691,441, which is a continuation of and claims priority to U.S. patent application Ser. No. 13/546,919, filed Jul. 11, 2012, now U.S. Pat. No. 9,135,978, the teachings of which are incorporated herein by reference.

TECHNICAL FIELD

Embodiments disclosed herein pertain to memory programming methods and memory systems.

BACKGROUND

Memory may include one-time programmable memory cells for use for various purposes. In one example conventional memory arrangement, one memory structure is provided for writing/reading data while a separate memory structure is provided for one-time programmable cells. One-time programmable cells may be programmed by a manufacturer of the memory or perhaps an end user customer who incorporates the memory into an end product. The one-time programmable cells are written to once and may be implemented as non-volatile memory, such as fuses or anti-fuses, to permanently store the one-time programmable data.

However, it has been recognized that one-time programmable data may be undesirably changed, reversed or un-programmed from its originally programmed state under some conditions. A charge retaining region of a flash memory cell utilized as a one-time programmable cell may gain or lose charge over time to an extent that the state of the flash memory cell is indeterminate or different than the originally-programmed state. The data level of a programmed cell may approach the read level of the cell to such an extent that the state of the memory cell may be indeterminate or incorrectly determined with respect to its originally programmed state.

At least some embodiments described below are directed towards methods and apparatus which provide increased data reliability and retention of data which is programmed once compared with some conventional memory arrangements.

DETAILED DESCRIPTION OF EXAMPLE EMBODIMENTS

At least some embodiments are directed towards apparatus and methods which utilize re-writable memory to store data which is not to be changed from its originally-programmed state after the original programming of the memory. The data which is only programmed once may be referred to as one-time programmed data and the re-writable memory used to store this data may be referred to as one-time programmed memory. At least some embodiments also provide re-writing of the one-time programmed data over time to assure that the data may be accurately read at subsequent moments in time after being originally-programmed into the one-time programmed memory. While the re-writable memory utilized to store the one-time programmed data in some embodiments is physically capable of being re-written to other states after initially being programmed, the contents of the one-time programmed memory (i.e., one-time programmed data) are not changed after being initially programmed in at least some embodiments. In at least one embodiment, user-initiated operations are utilized to trigger re-writing of the one-time programmed data. The re-writing of the one-time programmed data increases the reliability and retention of the data compared with arrangements where the data is not re-written. Additional examples are discussed below with respect to illustrative embodiments.

Figure 1:
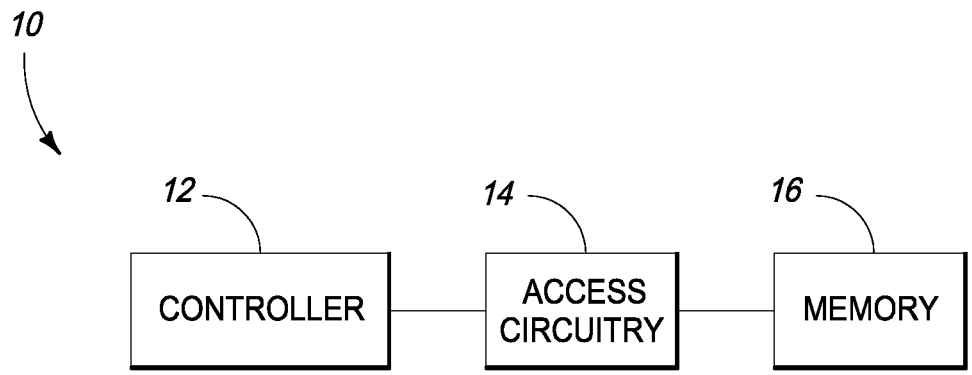
FIG. 1 is a simplified functional block diagram a memory system according to one embodiment.

Referring to FIG. 1, a functional block diagram of a memory system 10 is shown according to one embodiment. The illustrated memory system 10 includes a controller 12, access circuitry 14, and memory 16. In some embodiments, access circuitry 14 can be located with the controller 12, in memory 16 or upon a separate die from both. In one more specific embodiment, access circuitry 14 could be a bottom die with a stack of memory devices above it. Other embodiments of memory system 10 are possible and may include more, less and/or alternative components or circuitry. Memory system 10 may be implemented within or with respect to various associated devices (not shown), such as computers, cameras, media players, and thumb drives, in some examples. Memory system 10 stores data generated or utilized by the associated devices in the described examples.

Controller 12 controls operations of writing, reading and re-writing data of memory 16 as well as interfacing with other components or circuitry, such as sources of data to be stored within memory 16. Controller 12 may access and process user inputs such as commands with respect to memory 16 during operations of an associated device. Example commands instruct the generation of erase and program pulses which are applied to memory 16 in one embodiment. The application of erase and program pulses programs memory in one embodiment, and the application of an erase pulse and the application of a program pulse are both referred to as programming operations of memory in one embodiment. Other types of pulses may be utilized for programming in other embodiments.

In one embodiment, controller 12 is configured to process data, control data access and storage, issue commands, and control other desired operations. Controller 12 may comprise processing circuitry configured to execute programming provided by appropriate computer-readable storage media in at least one embodiment. In one embodiment, firmware of the controller 12 is stored in one-time programmed memory. For example, the controller 12 may be implemented as one or more processor(s) and/or other structure configured to execute executable instructions including, for example, software and/or firmware instructions. The programming may be stored within one or more computer-readable storage media of controller 12. The storage media may be non-transitory and be embodied in one or more articles of manufacture. Other example embodiments of controller 12 may include hardware logic, PGA, FPGA, ASIC, state machines, and/or other structures alone or in combination with one or more processor(s). These examples of controller 12 are for illustration and other configurations are possible.

Access circuitry 14 is coupled with controller 12 and memory 16 and is configured to implement addressing (selection of columns and rows of an array of memory 16), writing, reading and re-writing operations with respect to memory 16. For example, access circuitry 14 may receive instructions from controller 12 to select a specific page, word or byte of the memory 16 as well as implement writing, reading and re-writing with respect to a plurality of cells of the selected page, word or byte. As discussed below, the access circuitry 14 may re-write one-time programmed data stored in one-time programmed cells of the memory 16 while performing other writing and reading operations with respect to main cells of memory 16. The X and Y decoders may be positioned adjacent to any of the sides of an array of memory 16 in some embodiments.

Memory 16 can include a plurality of memory cells configured to store data, conductors, and perhaps additional circuitry. In one embodiment, memory 16 includes one portion which may be referred to as main memory and another portion which may include the one-time programmed memory. The main memory is a first storage location, or main block/array, of a plurality of main cells that are accessible to the user where the user is authorized to change the contents of the main memory. The one-time programmed memory is a second storage location, or secondary block/array, of a plurality of one-time programmed cells where the user is not authorized to change the data once it is programmed into the one-time programmed memory. The one-time programmed memory is not programmed by a user in one embodiment, but may be programmed by a manufacturer of memory 16, a manufacturer of an associated device which utilizes the memory 16, and/or another entity. One-time programmed data may include a manufacturer identifier, serial number, redundant information, firmware to control a memory system, or other information.

The main cells may be configured as volatile or nonvolatile cells (e.g., DRAM, CBRAM, phase change, programmable metallization or resistive) and may be utilized to store data for use within an associated device. The main memory is available to store data during operations of an associated device (e.g., storing image files generated by an imaging system of an associated device). Data stored within main memory may be referred to as main data. The main cells may be programmed to different states to store different main data at different moments in time in some embodiments. In a more specific embodiment, main memory may be implemented as multiple-time programmable memory which may be intentionally written to with different main data at different moments in time during operations of the associated device. In addition, some of the main memory may never be written to or utilized during operations of the associated device, or only written to once during operations of the associated device.

The one-time programmed cells may be configured as the same type of cells as the main cells and utilized to store data programmed by a manufacturer of the memory 16, a manufacturer of the memory system 10, a customer who implements the memory 16 in an associated device, or other appropriate entity. As mentioned above, data stored within one-time programmed memory may be referred to as one-time programmed data and the one-time programmed cells are programmed once with the one-time programmed data as discussed above. More specifically, the one-time programmed cells are programmed once and memory system 10 is configured such that the one-time programmed data stored in one-time programmed memory is retained, not written over once programmed, and is re-written as originally-programmed as discussed in further detail below. In one embodiment, some of the one-time programmed memory may never be written to or utilized.

Figure 2:
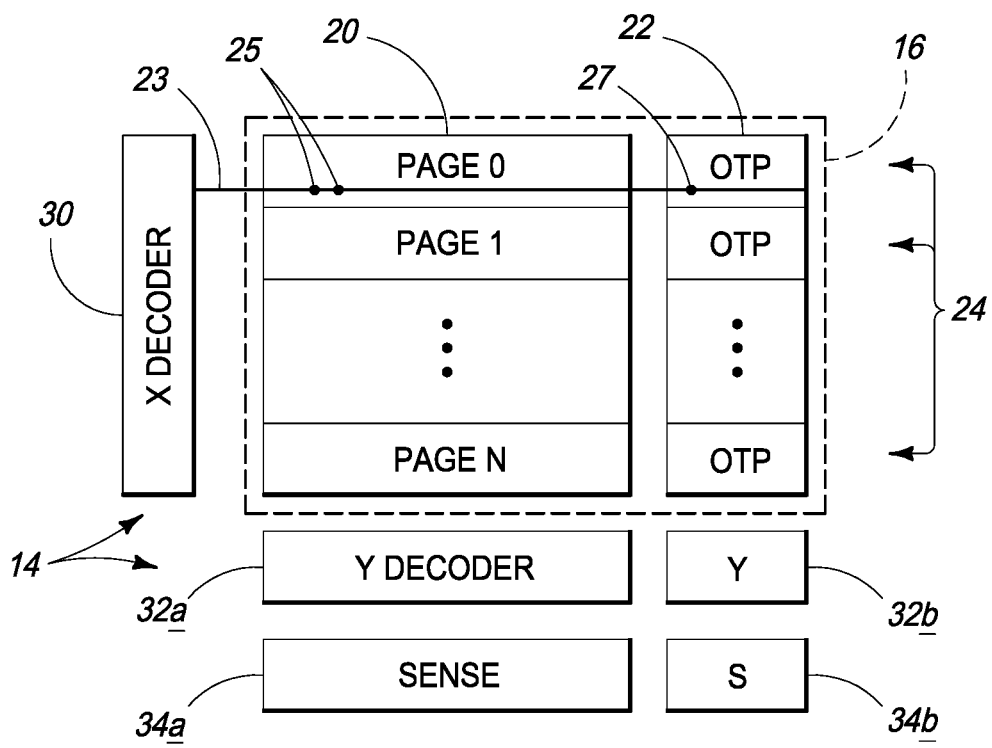
FIG. 2 is a block diagram of circuitry of the memory system according to one embodiment.

Referring to FIG. 2, details of one embodiment of access circuitry 14 and memory 16 are shown. In the illustrated embodiment, memory 16 includes respective portions of main memory 20 and one-time programmed memory 22 which include the same type of memory cells 25, 27. In addition, the memory 16 may be arranged as a plurality of pages 24 shown as Page 0-Page N in the illustrated embodiment. Although only Page 0 is shown as including cells 25, 27 (and word line 23), it is to be understood that all pages 24 may include a respective word line 23 and cells 25, 27.

In one embodiment, main memory 20 of a single page 24 includes more main cells 25 than one-time programmed cells 27 of one-time programmed memory 22 of the same page. Normal memory 20 of an individual page 24 may include, depending upon the type of memory utilized, between 16-8000 main cells 25 while the one-time programmed memory 22 for the same page 24 may include between 1-8 one-time programmed cells 27 in example embodiments. Different numbers of cells 25, 27 may be provided within an individual page 24 in other embodiments.

While all of the illustrated pages 24 in FIG. 2 include one-time programmed cells 27, one or more pages 24 may not include one-time programmed cells in at least one other embodiment. The main and one-time programmed memory 20, 22 are diagrammatically shown as being separated from one another in FIG. 2 and may be implemented as separate memory structures or arrays. However, in some embodiments, the memory portions 20, 22 may be different portions of a common memory structure (e.g., different portions of a common memory array) and the individual pages 24 may include both main and one-time programmed cells 25, 27 where the one-time programmed cells 27 may be addressed and accessed with the main cells 25 of the respective page 24, for example by selection of a respective common word line 23.

Although the main and one-time programmed cells of a given page 24 may be accessed simultaneously in some embodiments described herein, only the main memory 20 is available to the associated device for storage of data during user operations of the associated device, while the one-time programmed memory 22 is reserved for one-time programmed data programmed by the manufacturer of the memory, manufacturer of the associated device, end customer which implements the memory in the associated device or end product, etc.

In the illustrated embodiment, access circuitry 14 is implemented as an X decoder 30, a plurality of Y decoders 32a, 32b, and a plurality of sense amplifiers 34a, 34b. X and Y decoders 30, 32a, 32b and sense amplifiers 34a, 34b operate to access desired pages 24 and cells 25, 27 of main and one-time programmed memory portions 20, 22 for reading, writing and re-writing of data within the main and one-time programmed cells.

As mentioned above, the memory 16 of the embodiment shown in FIG. 2 includes a plurality of pages 24 which correspond to a plurality of rows. In one embodiment, X decoder 30 may select one of the pages 24 for reading, writing and re-writing of the main and one-time programmed cells 25, 27 of the selected page 24. More specifically, each of the pages 24 may have an associated word line 23 which may be selected by X decoder 30 to activate and enable programming of the main cells 25 and re-writing of the one-time programmed cells 27 of the selected page 24. In one arrangement, Y decoders 32a, 32b determine which ones of the main cells 25 and one-time programmed cells 27 receive program and erase pulses, respectively. In one embodiment, the main cells 25 and the one-time programmed cells 27 of different pages 24 are arranged with respect to a plurality of columns which are addressable and selected by the Y decoders 32a, 32b. In one more specific embodiment, the main cells 25 of the pages 24 may be arranged with respect to a first group of columns and the one-time programmed cells 27 may be arranged with respect to a second group of columns.

One-time programmed memory 22 is written once with one-time programmed data as mentioned above. Thereafter, it is not utilized to store main data during operations of the associated device, but rather main data utilized and generated by operations of the associated device is stored in main memory 20. Accordingly, in one embodiment, Y decoder 32a is utilized to access the main memory cells 25 during operations of the associated device while decoder 32b is utilized to access the one-time programmed memory cells 27. In some embodiments, Y decoders 32a, 32b and sense amplifiers 34a, 34b may be implemented as a single Y decoder and a single sense amplifier, respectively, and the associated device may only access addresses within main memory 20 for writing main data during user operations, while the one-time programmed cells 27 are only re-written.

Data stored within memory 16 (e.g., binary 0's data and 1's data) including one-time programmed data within one-time programmed memory 22 may, upon initial programming, have respective data levels (e.g., voltages, states, resistances) which enable the data to be easily determinable with respect to a read level of the memory 16. However, over time, the data levels of data stored within memory 16, including one-time programmed memory 22, may degrade with respect to the read level, and perhaps reach a level sufficiently close to the read level that the data is no longer accurately determinable. Some embodiments of the disclosure re-write the one-time programmed data of one-time programmed memory 22 at a plurality of different moments in time to increase the retention, reliability and integrity of the one-time programmed data (i.e., ability to distinguish the states of the one-time programmed data stored in the one-time programmed cells 27) for longer periods of time compared with arrangements which do not re-write the one-time programmed memory 22 at the plurality of moments in time.

In one operational embodiment, actions by a user of an associated device in which the memory 16 is incorporated will result in the re-writing of one-time programmed data of one-time programmed memory 22 at the different moments in time. In one more specific embodiment, user commands may result in the generation of erase and program pulses which are applied at different moments in time to the cells of main memory 20 during operations of the associated device. In one embodiment, a plurality of re-write pulses may be applied to one-time programmed cells 27 of one-time programmed memory 22 to re-write the one-time programmed data stored therein corresponding to the application of erase and program pulses to program main cells 25 of the main memory 20. In some embodiments, the erase and program pulses are both utilized to program the main cells 25 as well as simultaneously re-write the one-time programmed cells 27. The application of the re-write pulses to the one-time programmed memory 22 increases the differences of the data levels of the contents of the one-time programmed memory 22 with respect to the read level resulting in one-time programmed data which may be readily determinable by the sense amplifier 34b as discussed further below with respect to FIG. 5.

In one more specific embodiment, assume the controller 12 is erasing the contents of main memory 20 of a given page 24 (e.g., Page 1) during operations of the associated device in which the memory 16 is utilized. The X decoder 30 operates to select the word line 23 of the selected page 24 to activate the main cells 25 of the selected page 24. In one embodiment mentioned above, the one-time programmed cells 27 of the corresponding selected page 24 may also be coupled with the word line 23 selected by X decoder 30. Accordingly, the selection of the word line 23 for the desired page 24 results in the simultaneous activation of the corresponding one-time programmed cells 27 of the desired page 24 as well as the main cells 25 of the desired page 24. Following selection of the respective word line 23 for the desired page 24, controller 12 may control the application of a common erase pulse to appropriate main cells 25 of main memory 20 and appropriate one-time programmed cells 27 of one-time programmed memory 22 using Y decoders 32a, 32b. While appropriate main cells 25 of the selected page 24 may receive the erase pulse in some embodiments, controller 12 may read or access the contents of the one-time programmed memory 22 to determine which specific one-time programmed cells 27 are also to receive the common erase pulse which would operate to re-write the respective one-time programmed cells 27 (e.g., re-write 1's one-time programmed data). The re-writing of the one-time programmed data is automatic and implemented without specific user instruction which instructs the re-writing in one embodiment.

Furthermore, some of the main cells 25 of main memory 20 for the desired page 24 may also receive a program pulse during programming. Following assertion of the respective word line 23 for the desired page 24, controller 12 may control the application of the program pulse to appropriate main cells 25 of main memory 20 and appropriate one-time programmed cells 27 of one-time programmed memory 22. Controller 12 may read or access the contents of the one-time programmed memory 22 to determine which specific one-time programmed cells 27 are to receive the program pulse which would operate to re-write the respective one-time programmed cells 27 (e.g., re-write 0's one-time programmed data). Accordingly, appropriate one-time programmed cells 27 of the one-time programmed memory 22 are re-written simultaneously with the application of the erase and program pulses to the main cells 25 of main memory 20 in one embodiment. More specifically, a common erase pulse may re-write 1's data of the one-time programmed memory 22 along with erasure of main cells 25 and a common program pulse may re-write 0's data of the one-time programmed memory 22 while being applied to appropriate main cells 25. Again, the re-writing of the one-time programmed data is automatic and implemented without specific user instruction which instructs the re-writing in one embodiment.

Figure 3:
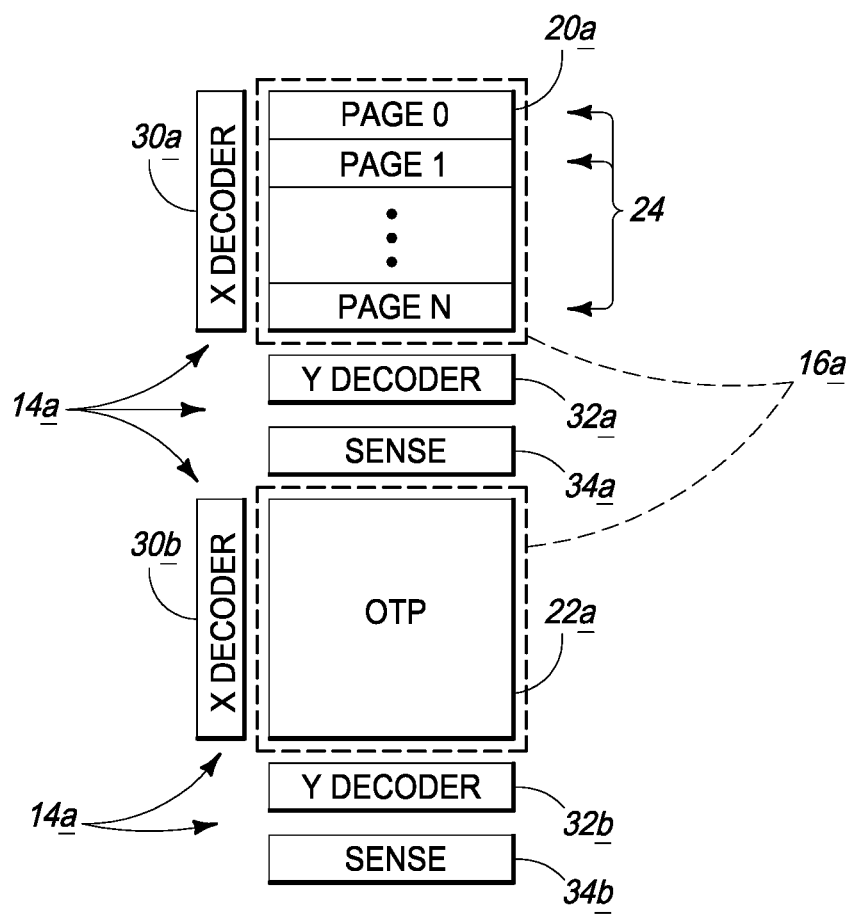
FIG. 3 is a block diagram of circuitry of the memory system according to one embodiment.

Referring to FIG. 3, details of an embodiment of access circuitry 14a and memory 16a are shown. In the embodiment of FIG. 3, the main and one-time programmed memory 20a, 22a are not activated by a common word line from a single X decoder, but rather a plurality of X decoders 30a, 30b are provided for asserting plural word lines (not shown) which activate memory cells of main memory 20a and one-time programmed memory 22a, respectively. Accordingly, the main cells and one-time programmed cells may be activated and accessed separately in one embodiment. Furthermore, the main and one-time programmed memory 20a, 22a may be implemented within different memory structures (e.g., different memory arrays) and which may be the same or different types of memory in one embodiment.

More specifically, in the illustrated example, X decoder 30a asserts word lines of respective pages 24 of main memory 20a to activate the main cells and X decoder 30b asserts word lines of respective pages 24 of one-time programmed memory 22a to activate the one-time programmed cells. Program and erase pulses may be applied by Y decoder 32a to appropriate main cells to program and erase the main bits of main data and program and erase pulses may be applied by Y decoder 32b to appropriate one-time programmed cells to re-write the one-time programmed bits of one-time programmed data. The contents of the main cells may be sensed by sense amplifier 34a and contents of one-time programmed cells may be sensed by one-time programmed amplifier 34b in the illustrated example embodiment.

Figure 4:
FIG. 4 is an illustrative representation of addressing of main memory and one-time programmed memory according to one embodiment.

The embodiment of FIG. 3 may provide increased frequency of re-write of one-time programmed cells compared with the embodiment of FIG. 2 in some implementations. For example, the size of one-time programmed memory 22a (i.e., number of cells) may be less than the size of main memory 20a. Referring to FIG. 4, some of the address bits which are utilized to access pages of one-time programmed memory 22a may also be associated with addresses which are utilized to access pages of main memory 20a in one embodiment. In the illustrated example of FIG. 4, addressing of pages A0-A4 of main memory also results in addressing of one-time programmed addresses A0-A4. If all pages A0-Amax of main memory are accessed, one-time programmed bits are re-written a number of times equal to (# of page address bits)−(# of one-time programmed address bits)+1, which provides an increased frequency of re-write compared with the arrangement shown in FIG. 2.

Figure 4A:
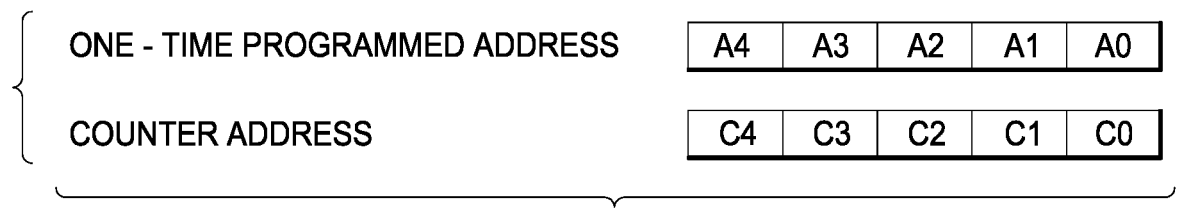
FIG. 4A is an illustrative representation of a counter according to one embodiment.

In one embodiment, one-time programmed data addresses can be associated with a number of operations with respect to the main memory if a counter is provided which stores how many operations have been performed with respect to the main memory. For example, referring to FIG. 4A, a counter may be provided which has an appropriate number of bits of volatile memory (e.g., five bits in the example of FIG. 4A) in one embodiment. The data of the counter may be cleared or randomly written when memory system 10 is powered up. The bits of the counter may be associated with the one-time programmed memory addresses such that the address corresponding to the value of the counter is re-written during the next re-writing operation. The counter may thereafter be counted up or down to select a new address for re-writing after a re-writing operation of one-time programmed data to the presently-selected address and as a result of programming or erasing operations with respect to the main memory (e.g., the counter may be counted up (or down) corresponding to individual program or erase operations in one example). Furthermore, the counter may be reset to a minimum or maximum value as a result of reaching a maximum or minimum value, respectively.

Figure 5:
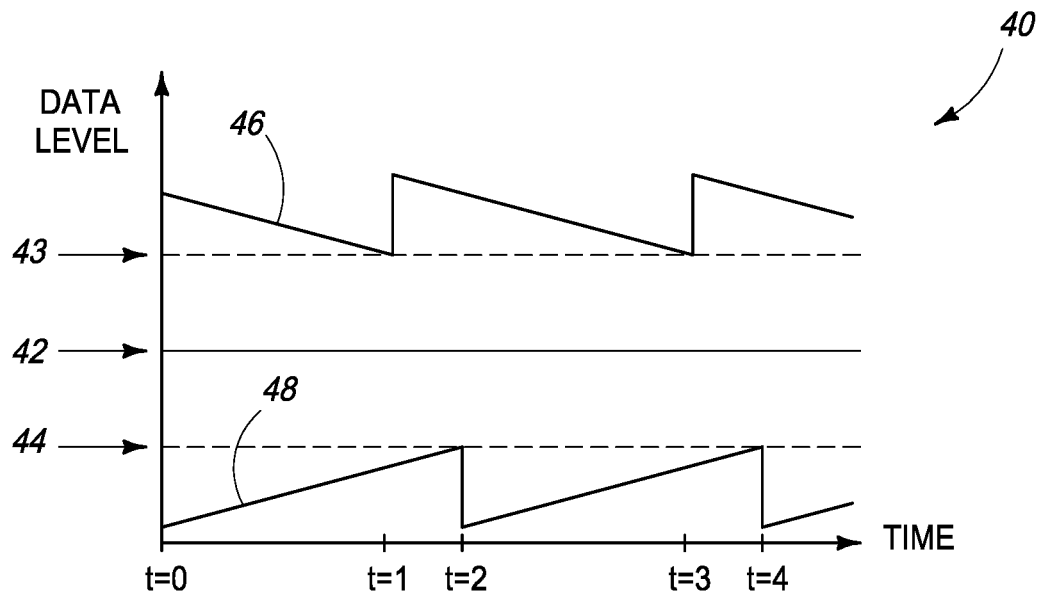
FIG. 5 is a graphical representation of data levels of one-time programmed data over time according to one embodiment.

Referring to FIG. 5, a graphical representation of data levels (e.g., voltage, current or resistance) of one-time programmed bits relative to a read level 42 are shown versus time (data levels are shown on the y axis and time is shown on the x axis progressing to the right). Line 46 corresponds to 0's data and line 48 corresponds to 1's data in the illustration. Furthermore, a plurality of thresholds relative to the read level 42 in the form of a program verify level 43 and an erase verify level 44 are also shown spaced from read level 42. It is desired in some embodiments to maintain the 0's data above the program verify level 43 and the 1's data below the erase verify level 44 to enable the sense amplifiers to determine the appropriate states of the bits being accessed.

At an initial time t=0, both the 0's and 1's data have respective data levels relative to read level 42. As time progresses to the right in FIG. 5, the data levels degrade towards the read level 42 as shown by lines 46, 48. At times t=1 and 3, a program pulse has been applied to the 0's one-time programmed bits which results in the re-writing of the 0's one-time programmed data. At times t=2 and 4, an erase pulse has been applied to the 1's one-time programmed bits which results in the re-writing of the 1's one-time programmed data. The re-writing of the one-time programmed data increases differences of the data levels of the 0's and 1's one-time programmed data relative to the read level 42 to enable the sense amplification circuitry to correctly determine the respective states of the one-time programmed data.

In some embodiments discussed above, the one-time programmed bits may be re-written along with the assertion of program and erase pulses with respect to the main cells without user instruction. For example, the 0's one-time programmed data may be re-written by a program pulse when the program pulse is applied to the main memory and the 1's one-time programmed data may be re-written by an erase pulse when the erase pulse is applied to the main memory.

In one embodiment, the one-time programmed bits may be re-written as a result of their respective data levels. For example, in one implementation, one-time programmed bits may be re-written as a result of their respective data levels reaching a respective one of the program or erase verify levels 43, 44. In one more specific example, when a program pulse is to be asserted for 0's data in main memory, the data level of the 0's data within one-time programmed memory may be compared with respect to the program verify level 43. Using the comparison, all 0's bits within a page of one-time programmed memory which reach and/or are below the program verify level 43 may also be re-written with the program pulse while 0's bits within the page of one-time programmed memory which are above the program verify level 43 will not receive the program pulse. In another example, all of the 0's bits in a page of one-time programmed memory may receive a program pulse if one or more 0's bits in the page of one-time programmed memory reach or are below the program verify level 43. Similarly, the 1's bits in the one-time programmed memory may also be re-written if one or more 1's bit in the one-time programmed memory reach or are above the erase verify level 44 during the application of an erase pulse to main memory.

Figure 6:
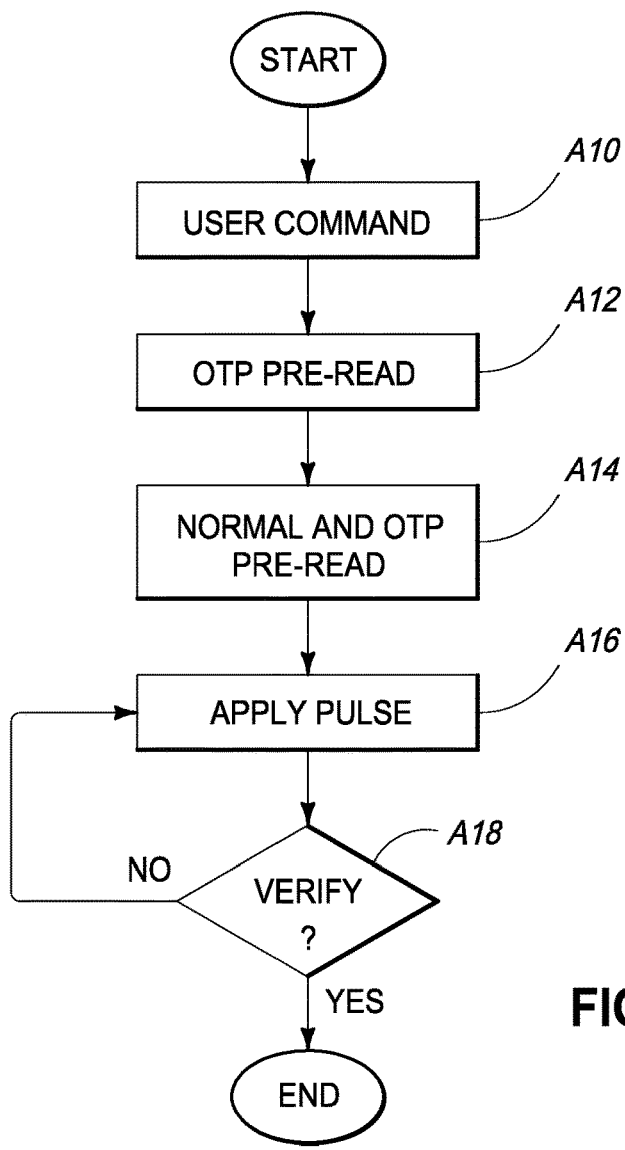
FIG. 6 is a flow chart of programming of main memory and re-writing one-time programmed memory according to one embodiment.

Referring to FIG. 6, a method of re-writing one-time programmed data is shown according to one embodiment. The method may be performed by the controller 12 of FIG. 1 in but one implementation. Other methods are possible including more, less and/or alternative acts. The example discussed below of FIG. 6 proceeds with respect to the example embodiment shown in FIG. 2 although the method may be utilized in other embodiments as well.

At an act A10, a user action, such as a program command or erase command, instructs the application of a program or erase pulse to the main memory. The generated command may be accessed and utilized to initiate programming of main memory and re-writing of one-time programmed memory as described in subsequent acts of FIG. 6.

At an act A12, a one-time programmed pre-read action is performed where the one-time programmed bits are read with respect to the "read level" to determine the state of the one-time programmed bits as 0's and 1's. The results of this action may be utilized to determine which of the one-time programmed bits are to receive either the program pulse (0 bits) or erase pulse (1 bits) based upon their respective states (i.e., if an erase pulse is to be applied, it is determined which of the one-time programmed bits are 1's to receive the erase pulse).

At an act A14, a main and one-time programmed pre-read action is performed where the main and one-time programmed bits are read with respect to the verify levels to determine which 0's bits are at or below the program verify level and which 1's bits are at or above the erase verify level and are to receive either the program pulse (0 bits) or erase pulse (1 bits).

At an act A16, a program pulse or an erase pulse is applied to the appropriate main bits for programming according to the main data to be stored and to the appropriate one-time programmed bits for re-writing the one-time programmed data. The appropriate one-time programmed bits to receive the program or erase pulse were identified in acts A12 and A14 in the described example.

At an act A18, the main bits and the one-time programmed bits are verified after the application of the program pulse or erase pulse.

The process returns to act A16 for another application of the program or erase pulse if the verification fails. Otherwise, if the verification is acceptable, the process terminates until another appropriate user command is accessed whereupon the process of FIG. 6 is repeated.

The acts of comparing the one-time programmed data with respect to the program and verify levels prior to re-writing may reduce stresses upon the one-time programmed memory by avoiding unnecessary re-writing of the one-time programmed data (i.e., re-writing of data when the data has suitable data levels with respect to the read level). In particular, the repetitive re-writing pulses over time may result in dielectric breakdown of the memory cells or increased power consumption in some implementations. However, in some embodiments, the comparison of the contents of the one-time programmed bits with respect to the erase and program verify levels may be omitted and the appropriate one-time programmed bits may be re-written with the user commands instructing a program or erase operation.

Sensing circuitry may utilize a voltage sensing scheme or current sensing scheme for program verify operations, erase verify operations and pre-read operations (e.g., with respect to the one-time programmed data). A particular circuit configuration may be selected based upon various design parameters of a device, such as speed, accuracy, size, efficiency and power.

Figure 7:
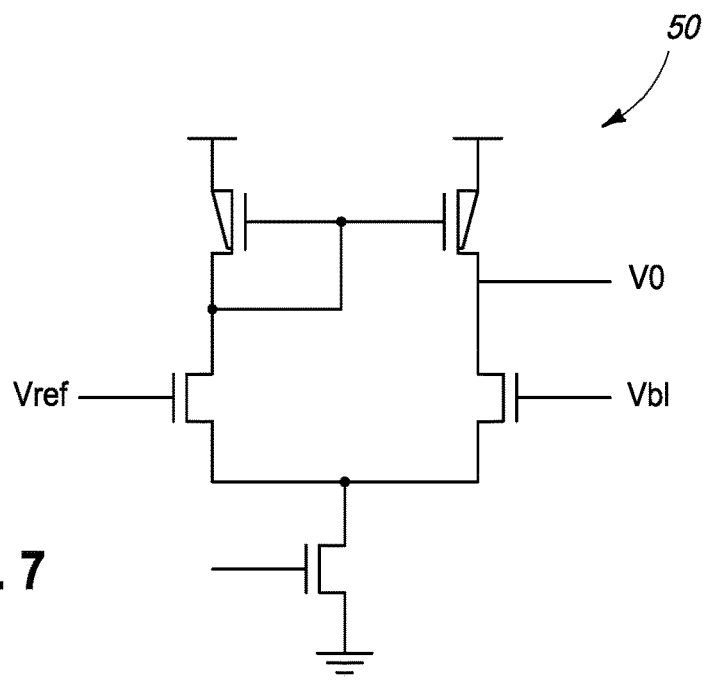
FIG. 7 is a circuit diagram of sensing circuitry according to one embodiment.

Referring to FIG. 7, one embodiment of sensing circuitry 50 is shown configured as a differential sensing amplifier. Vref is a threshold or reference voltage corresponding to a verify level or read level and Vbl represents a data level of a selected main cell or one-time programmed cell. Vo depends on the level of Vref and Vbl which judges if verification passed or failed. The threshold or reference voltage may change according to program verify, erase verify or pre-read operations as well as the programming of main memory and one-time programmed memory.

While some of the embodiments are described with respect to main and one-time programmed memory both being implemented as the same type of memory, it is to be understood that other types of memory may be utilized and main and one-time programmed memory may be implemented as different structures and/or types of memory in a single memory system in some embodiments. For example, main memory may be implemented as DRAM memory and one-time programmed memory may be implemented as resistive or phase change memory or flash memory in one possible embodiment.

CONCLUSION

In some embodiments, a memory programming method comprises programming a plurality of first main cells of a main memory, erasing a plurality of second main cells of the main memory, first re-writing one-time programmed data within a plurality of first one-time programmed cells of a one-time programmed memory during the programming, and second re-writing one-time programmed data within a plurality of second one-time programmed cells of a one-time programmed memory during the erasing.

In some embodiments, a memory programming method comprises, using a word line, activating a plurality of main cells and one-time programmed cells which are coupled with the word line, programming at least some of the activated main cells to store main data, and re-writing one-time programmed data of at least one of the activated one-time programmed cells which was previously programmed with the one-time programmed data.

In some embodiments, a memory programming method comprises accessing a plurality of user commands, as a result of the accessing one of the user commands, programming a plurality of first main memory cells which are individually configured to store a bit of main data having a first state, as a result of the accessing an other of the user commands, erasing a plurality of second main memory cells which are individually configured to store a bit of main data having a second state, reading one-time programmed data stored in a plurality of one-time programmed memory cells, using the reading, identifying some of the one-time programmed memory cells as storing data having the first state, using the reading, identifying others of the one-time programmed memory cells as storing data having the second state, as a result of the accessing the one of the user commands, automatically re-writing the one-time programmed data having the first state, as a result of the accessing the other of the user commands, automatically re-writing the one-time programmed data having the second state, and wherein the automatically rewritings individually comprise re-writing in the absence of a user command which instructs the respective re-writing.

In some embodiments, a memory system comprises main memory comprising a plurality of main cells, one-time programmed memory comprising a plurality of one-time programmed cells, and circuitry configured to program the main cells to store main data as a result of a user command and to re-write one-time programmed data stored in the one-time programmed cells as a result of the user command.

In some embodiments, a memory system comprises memory comprising a plurality of pages, and circuitry configured to program the pages with main data and to re-write one-time programmed data stored in the pages at a plurality of moments in time.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A memory system comprising:
a one-time programmed memory comprising a plurality of one-time programmed cells which individually have only one of a plurality of different states after programming of the one-time programmed cells; and
access circuitry configured to re-write the states of the one-time programmed cells at a plurality of moments in time after the programming of the one-time programmed cells.

2. The memory system of claim 1 wherein some of the one-time programmed cells have a first of the different states and others of the one-time programmed cells have a second of the different states, and wherein the access circuitry is configured to provide a first pulse to the some of the one-time programmed cells to re-write the state of the some of the one-time programmed cells and to provide a second pulse to the others of the one-time programmed cells to re-write the state of the others of the one-time programmed cells.

3. The memory system of claim 2 further comprising main memory which comprises a plurality of main cells, and wherein the access circuitry provides the first pulse to some of the main cells during the provision of the first pulse to the some of the one-time programmed cells and provides the second pulse to others of the main cells during the provision of the second pulse to the others of the one-time programmed cells.

4. The memory system of claim 2 further comprising main memory which comprises a plurality of main cells, and wherein the access circuitry provides the first pulse and the second pulse as a result of user commands initiating storage of different bits of main data using the main cells.

5. A memory programming method comprising:
programming a one-time programmed cell to one of a plurality of different states at an initial moment in time; and
re-writing the one-time programmed cell to the one of the different memory states at a plurality of subsequent moments in time after the initial moment in time to retain the programming of the one-time programmed cell in the one of the different memory states.

6. The method of claim 5 wherein the re-writing comprises providing a pulse to the one-time programmed cell at each of the subsequent moments in time.

7. The method of claim 6 further comprising reading the one state of the one-time programmed cell, and wherein the providing the pulse is a result of the reading.

8. The method of claim 6 further comprising providing the pulse to at least one of a plurality of main cells of a main memory at each of the subsequent moments in time.

9. The method of claim 8 wherein the main cells and the one-time programmed cell are the same type of memory cell.

10. The method of claim 8 further comprising asserting a word line, and wherein the providing the pulse to the one-time programmed cell and the at least one main cell comprises providing using the asserted word line.

11. The method of claim 8 wherein the providing the pulse to the one-time programmed cell comprises providing as a result of the providing the pulse to the at least one of the main cells.

12. The method of claim 5 wherein the re-writing comprises re-writing as a result of data being written to a plurality of main cells of a main memory.

13. The method of claim 5 wherein the re-writing increases a difference of a data level of the one-time programmed cell with respect to a read level.

14. The memory system of claim 1 wherein each of the one-time programmed cells individually has the same one of the different states after the re-writing as the respective one-time programmed cell had after the programming and prior to the re-writing.

15. The memory system of claim 1 wherein the programming comprises providing a pulse to one of the one-time programmed cells, and wherein the providing the pulse decreases the electrical resistance of the one of the one-time programmed cells.

16. The memory system of claim 1 wherein each of the one-time programmed cells individually has at least substantially the same electrical resistance after the programming and after the re-writing.

17. The memory system of claim 1 wherein each of the one-time programmed cells are capable of being programmed to have one of only two different electrical resistances, and wherein the two different electrical resistances correspond to the different states.

18. The memory system of claim 1 wherein each of the one-time programmed cells having a first of the different states change between the different states only once as a result of the programming and the re-writing.

19. The memory system of claim 1 wherein the programming and the re-writing permanently provide and maintain each of the one-time programmed cells in its respective one of the different states.

20. The method of claim 5 wherein the one-time programmed cell has the one of the different states after the re-writing.

21. The method of claim 5 wherein the programming comprises providing a pulse to the one-time programmed cell, and wherein the providing the pulse decreases the electrical resistance of the one-time programmed cell.

22. The method of claim 5 wherein the one-time programmed cell has at least substantially the same electrical resistance after the programming and after the re-writing.

23. The method of claim 5 wherein the one-time programmed cell is capable of being programmed to have one of only two different electrical resistances, and wherein the two different electrical resistances correspond to the different states.

24. The method of claim 5 wherein the one-time programmed cell changes between the different states only once.

25. The method of claim 5 wherein the programming and the re-writing permanently provide and maintain the one-time programmed cell in the one of the different states.

26. The memory system of claim 1 wherein the access circuitry is configured to program and re-write one of the one-time programmed cells to permanently provide and maintain the one of the one-time programmed cells in its respective one of the different states.

\* \* \* \* \*